(12) United States Patent
Vu et al.

(10) Patent No.: US 10,854,772 B2
(45) Date of Patent: Dec. 1, 2020

(54) MULTI-PIECE SUBSTRATE HOLDER AND ALIGNMENT MECHANISM

(71) Applicant: Intevac, Inc., Santa Clara, CA (US)

(72) Inventors: Hoang Huy Vu, San Jose, CA (US);
Babak Adibi, Los Altos, CA (US);
Terry Bluck, Santa Clara, CA (US)

(73) Assignee: INTEVAC, INC., Santa Clara, CA (US)

( * ) Notice: Subject to any disclaimer, the term of this patent is extended or adjusted under 35 U.S.C. 154(b) by 218 days.

(21) Appl. No.: 16/040,387

(22) Filed: Jul. 19, 2018

(65) Prior Publication Data

US 2019/0027635 A1 Jan. 24, 2019

Related U.S. Application Data

(60) Provisional application No. 62/534,388, filed on Jul. 19, 2017.

(51) Int. Cl.
*H01L 31/18* (2006.01)
*H01J 37/317* (2006.01)
*H01L 31/0203* (2014.01)
*H01J 37/20* (2006.01)

(52) U.S. Cl.
CPC .......... *H01L 31/1876* (2013.01); *H01J 37/20* (2013.01); *H01J 37/3171* (2013.01); *H01L 31/0203* (2013.01); *H01L 31/1804* (2013.01); *H01J 2237/204* (2013.01); *H01J 2237/2007* (2013.01); *H01J 2237/20221* (2013.01); *H01J 2237/31711* (2013.01)

(58) Field of Classification Search
CPC ................ B65G 35/06; B65G 47/8815; B65G 47/8869; B65G 54/02; B65G 2203/0225; B65G 2203/0233; B65G 2203/041; B25B 11/00; H01J 37/20; H01J 37/3171; H01J 37/3045; H01J 2237/204; H01J 2237/202; H01J 2237/2007; H01J 2237/20; H01J 2237/20235; H01L 31/0203; H01L 31/1804
USPC ............... 269/903, 289 R, 309, 310, 21, 900
See application file for complete search history.

(56) References Cited

U.S. PATENT DOCUMENTS

| 5,180,941 A * | 1/1993 | Seki .................... | H02N 2/08 310/323.07 |
| 9,082,799 B2 * | 7/2015 | Weaver ................ | C23C 14/042 |
| 2013/0105087 A1 * | 5/2013 | Cho ..................... | H02N 13/00 156/345.43 |
| 2016/0042913 A1 * | 2/2016 | Adibi .................... | H01J 37/185 250/453.11 |

* cited by examiner

*Primary Examiner* — Tyrone V Hall, Jr.
(74) *Attorney, Agent, or Firm* — Womble Bond Dickinson (US) LLP; Joseph Bach, Esq.

(57) ABSTRACT

A system for transporting substrates and precisely align the substrates horizontally and vertically. The system decouples the functions of transporting the substrates, vertically aligning the substrates, and horizontally aligning the substrates. The transport system includes a carriage upon which plurality of chuck assemblies are loosely positioned, each of the chuck assemblies includes a base having vertical alignment wheels to place the substrate in precise vertical alignment. A pedestal is configured to freely slide on the base. The pedestal includes a set of horizontal alignment wheels that precisely align the pedestal in the horizontal direction. An electrostatic chuck is magnetically held to the pedestal.

18 Claims, 5 Drawing Sheets

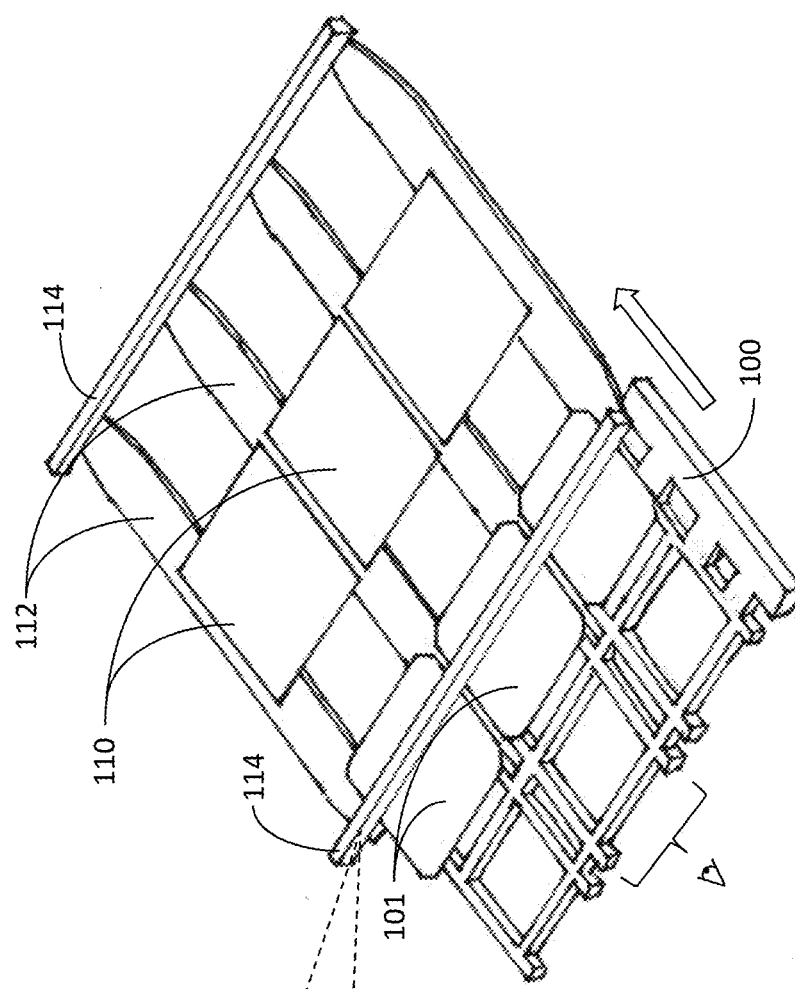
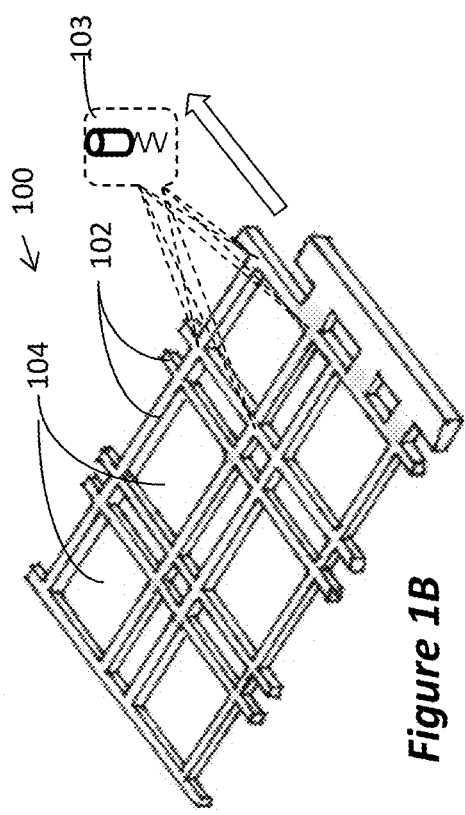
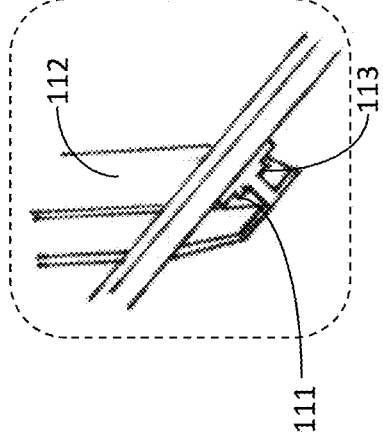
Figure 1A
Figure 1B

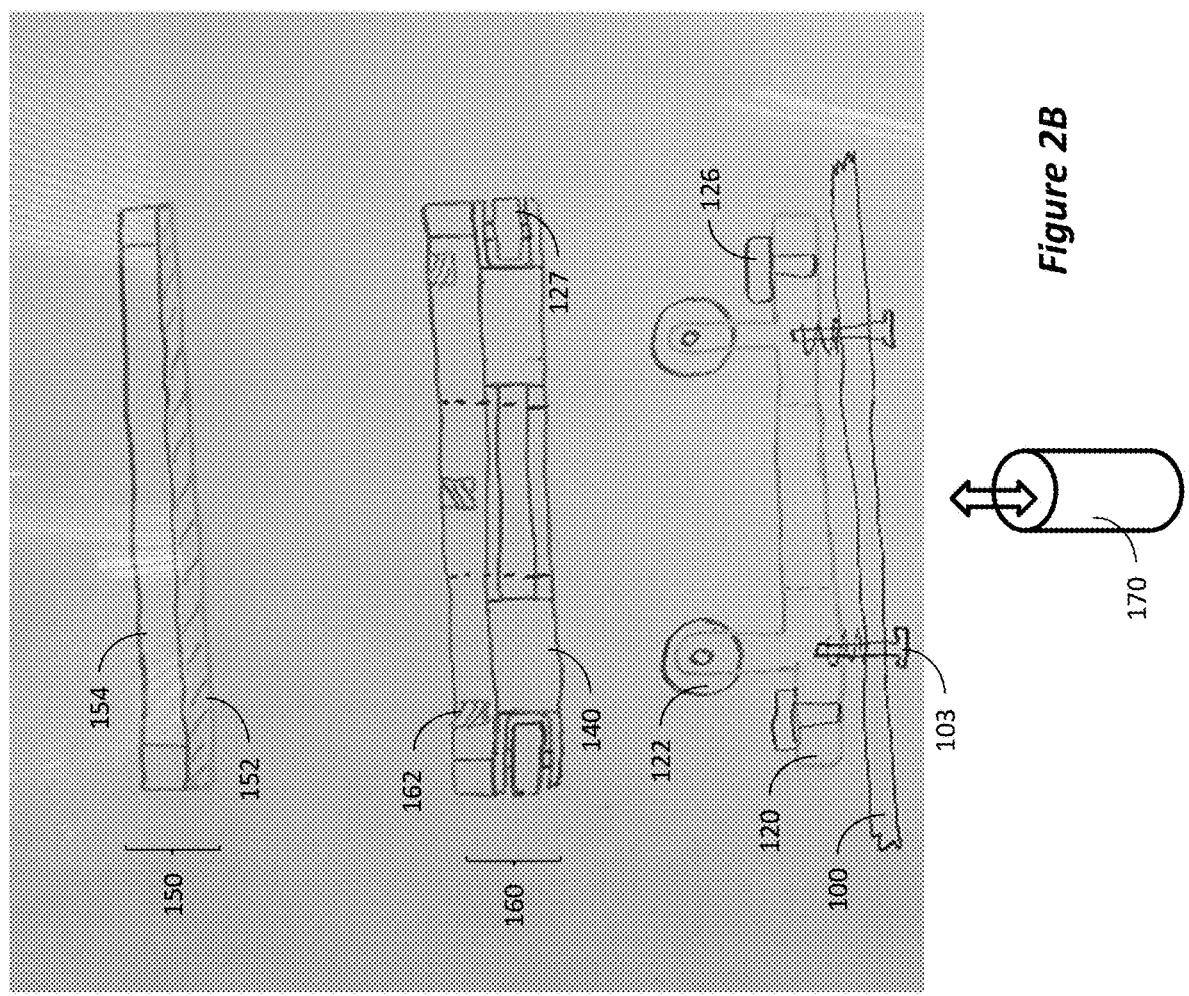

US 10,854,772 B2

MULTI-PIECE SUBSTRATE HOLDER AND ALIGNMENT MECHANISM

CROSS-REFERENCE TO RELATED APPLICATIONS

This application claims priority from U.S. Provisional Applications No. 62/534,388, filed Jul. 19, 2017, the disclosure of which is incorporated herein by reference in its entirety.

BACKGROUND

1. Field

This disclosure relates generally to alignment of wafers in semiconductor fabrication. Disclosed embodiments are particularly useful in the field of solar cell fabrication and, specifically, for fabrication of patterned elements, such as selective emitter solar cells using ion implant process.

2. Related Art

Some processing of wafers need to be done with specific alignment of the wafer with respect to the processing system or a mask through which processing takes place. This alignment needs to be precise and repeatable at each station and for each processing wafer.

According to one specific example, each wafer needs to be aligned to a reference edge and held in position with a +/−15 um alignment accuracy through multiple process steps. Also, wafer thermal expansion due to the processing, e.g., implant beam power, needs to be controlled.

Selective-Emitter solar cells are well known in the art. The advantages of a selective-emitter solar cell include a low contact resistance due to heavy doping underneath the metal grid, improved front-surface passivation of the lightly doped region between the grid, and reduced recombination under the metal contact.

Selective emitter solar cells have highly doped lines under the metal fingers. Generally this is done by forming a mask directly on the surface of the cell and etching the pattern of the doped lines. An example for such a process is disclosed in U.S. Pat. No. 9,853,178. However, it is also known that doping profile can be better controlled by using ion implant. Improved doping profile can provide enhanced cell efficiency. However, traditionally ion implant process is also performed using mask formed directly on the substrate with an etched circuitry, making such a process prohibitively expensive for solar cell fabrication.

The use of a "shadow mask" which is placed above the substrate can be attractive for ion implanting to generate patterned doping, e.g., for selective emitter solar cells. However, the difficulty with shadow mask is proper alignment of each consecutive substrate in a commercially viable production environment. The preference is to align each wafer separately to a corresponding mask. Therefore, one solution has been to place the shadow mask directly on the wafer and transport the wafer and the masks together. However, such solution requires mechanisms to properly place the masks onto the wafer in proper alignment. Also, as the masks travel through the system, it requires cleaning, which adds processing time and cost.

Applicant has previously disclosed a system enabling alignment of substrates for ion implant process in U.S. Pat. No. 9,543,114. In that system the mask need not be placed on top on the wafer. However, that system enables processing one wafer at a time. Accordingly, a need exists in the art for improved alignment of shadow masks for performing patterned doping, e.g., ion implant of selective emitter solar cells. Preferably, the alignment can be done for a plurality of wafers simultaneously.

SUMMARY OF THE INVENTION

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed embodiments enable processing a substrate using one or more shadow masks, all precisely aligned to the substrate. This enables generating multiple patterns on the substrates, all inter-aligned.

In disclosed embodiments, the operations of transporting of the substrates, the vertical alignment of the substrate, and the horizontal alignment of the substrate are all decoupled from each other. Such decoupling reduces the cost of the transport system, as it need not have tolerances corresponding to the alignment of the substrate. Decoupling the vertical and horizontal alignment enables precise alignment of multiple wafers simultaneously and repeatedly.

According to disclosed embodiments, the substrate holder need not be precisely oriented throughout its transport through the system. Rather, in each processing station, an alignment mechanism is provided that ensures precise vertical and horizontal orientation of the holder, such that the substrate is precisely aligned. It should be understood that the reference to "masks" in this context is to a mask that is made of a thin sheet with openings to precisely control the where the ions reach the substrate, e.g., thin (<10 mm) sheet of material such as graphite or SiC. These types of masks are sometimes referred to as a shadow masks.

In the disclosed embodiments, a system for transporting substrates in a processing system is provided, comprising: a carriage configured for supporting and transporting a plurality of chuck assemblies; a plurality of chuck assemblies positioned loosely on the carriage, each of the chuck assemblies comprising: a plurality of vertical height control rollers configured to control vertical position of the substrate; a plurality of horizontal alignment rollers configured to control horizontal position of the substrate; an electrostatic chuck configured to hold a substrate in precise alignment to the vertical control rollers and the horizontal alignment rollers.

In general aspects, a system for transporting substrates in a processing system comprises a carriage upon which a plurality of chuck assemblies are loosely positioned, wherein each of the chuck assemblies is configured to hold a single substrate and includes: a base having vertical alignment wheels configured to place the substrate in precise vertical alignment, a pedestal configured to freely slide on the base, a set of horizontal alignment wheels attached to the pedestal and is configured to precisely align the substrate in horizontal direction, and an electrostatic chuck position over the pedestal.

According to further aspects, a system for transporting substrates in a processing system comprises: a carriage upon which a plurality of chuck assemblies are loosely positioned, the carriage configured for transporting the plurality of pedestals in a processing system; wherein each of the chuck assemblies is configured to hold a single substrate and comprises: a base having vertical alignment wheels configured to engage vertical alignment straight edge to thereby place the base in precise vertical alignment to the vertical alignment straight edge; a pedestal slidably positioned on the base; a set of horizontal alignment wheels attached to the base and configured to engage a horizontal alignment straight edge to thereby precisely align the pedestal in horizontal direction to the horizontal alignment straight edge; an electrostatic chuck removably positioned over the pedestal.

According to disclosed aspects, each of the chuck assemblies may further comprise a base, wherein the vertical height control rollers are attached to the base; and a pedestal slidably positioned on top of the base and wherein the horizontal control rollers are attached to the pedestal. The embodiments may further include vertical urging mechanism urging each of the chuck assemblies vertically upwards from the carriage.

Disclosed embodiments may include a plurality of shadow masks; a plurality of tracks positioned in precise alignment to the shadow masks; wherein the vertical height control rollers and the horizontal control rollers are configured to engage the tracks to thereby align the substrates to the shadow masks. Also, each of the plurality of tracks may comprise a vertical alignment wall and a horizontal alignment wall; and wherein the vertical height control rollers are configured to engage the horizontal alignment wall and the vertical horizontal control rollers are configured to engage the horizontal alignment wall.

Other aspects include an ion implant system having and ion source generating an ion beam; a plurality of masks positioned on tracks in the fight path of the ion beam, each of the masks being aligned to respective tracks; a carriage configured to transport a plurality of chuck assemblies under the masks; a plurality of chuck assemblies positioned on the carriage, each of the chuck assemblies having a first means to align the chuck assembly vertically to the tracks and a second means, operating independently of the first means to align the chuck assembly horizontally to the tracks. In these embodiments, the first means may be vertical height control rollers and the second means may be horizontal control rollers. In these embodiments, each of the chuck assemblies may be configured to hold a single substrate and comprises: a base having vertical alignment wheels configured to place the base in precise vertical alignment to one of the shadow masks; a pedestal configured to freely slide on the base; a set of horizontal alignment wheels attached to the pedestal and configured to precisely align each of the pedestals in horizontal direction to one of the shadow masks; and, an electrostatic chuck attached to the pedestal.

BRIEF DESCRIPTION OF THE DRAWINGS

Other aspects and features of the invention would be apparent from the detailed description, which is made with reference to the following drawings. It should be appreciated that the detailed description and the drawings provides various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1A illustrates an embodiment of the alignment system in an ion implant application, according to one embodiment, while FIG. 1B illustrates an example of a carrier for use in the system of FIG. 1A.

FIG. 2A illustrates a top view of an arrangement for electrostatic chuck, according to one embodiment of the invention, while FIG. 2B illustrates an exploded side view of the elements of the electrostatic chuck of FIG. 2A.

DETAILED DESCRIPTION

Figure 2A:
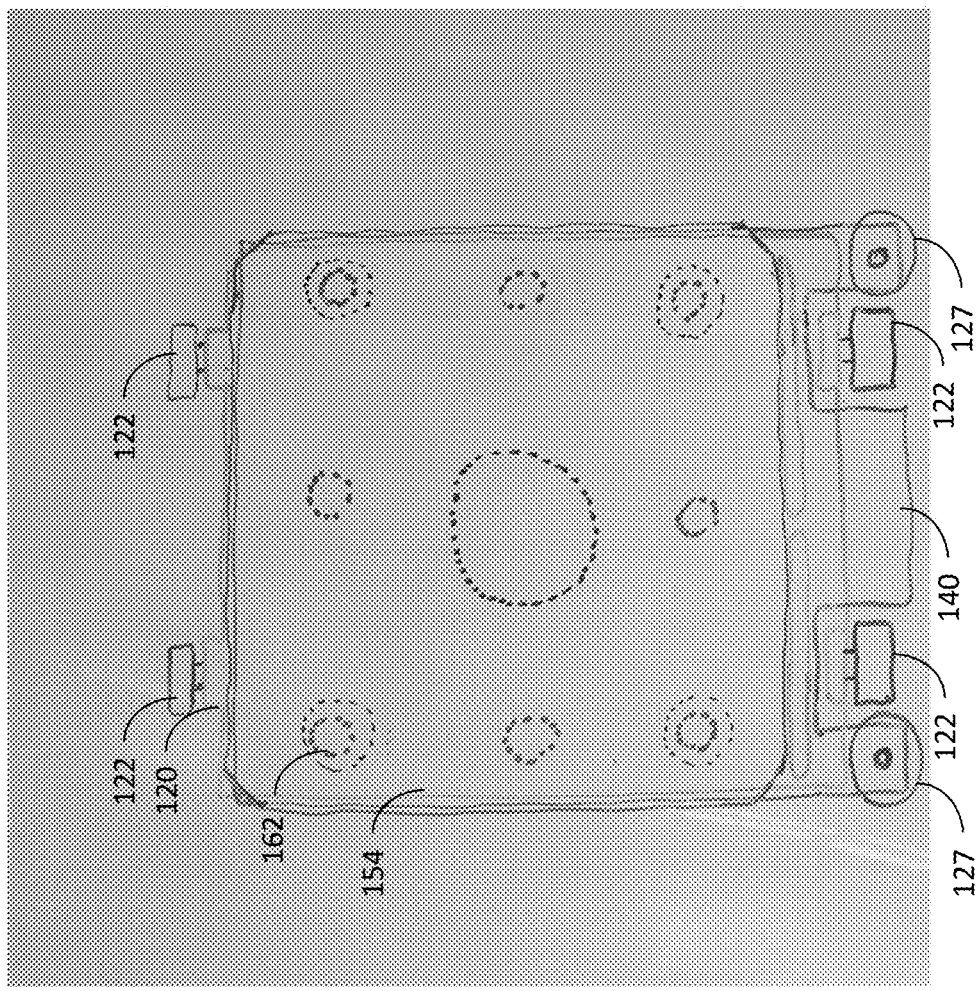

Embodiments of the inventive substrate alignment mechanism and its implementation in the manufacture of solar cells will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

The following embodiment enables the use of a simple and inexpensive carriage, which is configured to transport an array of wafers throughout the processing system. The carriage is simple and inexpensive as it need not have the same alignment tolerances as required by the wafer alignment to the shadow mask or other processing elements. Rather, at the processing station a mechanism is provided to align each wafer individually. Moreover, the vertical and horizontal alignments are decoupled from each other.

FIGS. 1A and 1B illustrate a general view of a simplified carrier of the system which supports the individual alignment of the substrates in processing stations. The embodiment illustrated in FIGS. 1A and 1B is particularly beneficial for ion implant fabrication of selective emitted or interdigitated back contact solar cells, but may be employed for other processing where accurate alignment is required.

The example of FIGS. 1A and 1B illustrate the use of the inventive system for ion implant of substrates using shadow masks. The shadow masks 110 are positioned with accurate alignment with respect to tracks (three shown), each track being defined by two opposing rails 112 attached to cross members 114. That is, each of the masks is individually aligned with respect to straight edge of a corresponding rail 112. As shown in the dash-line callout of FIG. 1A, each rail 112 has a vertical alignment wall 111 and a horizontal alignment wall 113, forming a vertical alignment straight edge and a horizontal alignment straight edge. Each of the masks 110 is positioned with precise alignment with respect to a corresponding vertical alignment wall 111 and a horizontal alignment wall 113. The carriage 100 moves in the direction shown by the arrow, such that it brings each of the substrates under its respective mask. As will be described later, each ESC assembly is then positioned with precise alignment to the vertical alignment wall 111 and a horizontal alignment wall 113. The wafer is consequently precisely aligned to the corresponding mask in the vertical and horizontal directions.

The carrier may be in the form of a simple transport mechanism that may carry one or more chuck (ESC) assemblies. One example is shown in FIG. 1A, wherein the carriage 100 is constructed simply of a grid of crisscross bars 102 and is configured to carry six ESC assemblies. The bars 102 form seats 104 over each of which one ESC assembly 105 is loosely positioned. As shown by the dash-line callout in FIG. 1A, an urging mechanism 103, such as a spring-loaded rod, is provided at each corner of each seat 104. Each ESC 105 is positioned over the four urging mechanisms 103, such that each ESC 105 is urged upward vertically away from the carriage. Alternatively, the urging mechanism may be attached to the ESC 105 itself, and urge against the bars 102.

The objective of the elements of the ESC assembly shown in FIGS. 2A and 2B is to precisely and reproducibly align a substrate 101 for processing. This arrangement can be used for various processing, such as stationary implant (wherein the substrates do not move during the implant process) or pass-by implant (wherein the substrates move under the masks during the implant process). In either case, each of the substrates 101 is precisely aligned under the respective mask 110 to form patterned doping.

The ESC assembly will now be described with reference to FIGS. 2A and 2B. Part of the carrier 100 is shown in FIG. 2B, together with the urging mechanism 103, here in the form of spring loaded pins. The base 120 sits loosely on the carrier 100 over the pins 103, such that it is urged vertically upwards, but it has the ability to move vertically and horizontally to a certain extent. The base 120 has a set of vertical alignment wheels 122, which engage a straight edge in the processing station so as to position the substrate at precise vertical height during processing. In one embodiment, the alignment wheels 122 are ABEC 9 precision rated bearings.

An ESC pedestal 140 is positioned slidably over the base 120 and glides over slide pads 126 so as to be able to move or rotate horizontally to a certain extent over the base 120. In this example the slide pads 126 are made of conductive Ultra-High Molecular Weight polyethylene (UHMW-PE) pads. The UHMW-PE pads are made conductive by the addition of carbon to the resin. The pads allow current flow from ESC to ground and provide a low friction surface for the ESC pedestal 160. Horizontal alignment wheels 127 are attached to the pedestal 160. In one embodiment, the alignment wheels 127 are ABEC 9 precision rated bearings. When entering a processing station, the horizontal alignment wheels engage a straight edge so as to align the pedestal 160 in the horizontal direction—perpendicularly to the direction of motion. Magnets 162 are positioned in the pedestal 160 so as to hold the electrostatic chuck, e.g., puck 150 in position. The substrate (not shown) is supported by the Electrostatic Chuck (ESC) puck 150, which is made of a steel backing plate 152 covered by a thin ESC plate 154. The ESC puck 150 firmly holds the wafer by electrostatic force. The ESC puck 150 provides a rigid structure for supporting and aligning the wafer to the reference edges.

By the arrangement shown in FIGS. 1A-2B, the operations of transporting of the substrates, the vertical alignment of the substrates, and the horizontal alignment of the substrates are all decoupled from each other. The transport is performed by the carriage 100 without the need to maintain high alignment precision. The base 120 is configured to only align the wafer vertically to a precise elevation with respect to a vertical alignment straight edge. Horizontal, i.e., sidewise alignment is done independently of the vertical alignment by the sliding of the pedestal 160 over the base 120, and engaging the horizontal alignment wheels 127 against a horizontal alignment straight edge.

Figure 3:
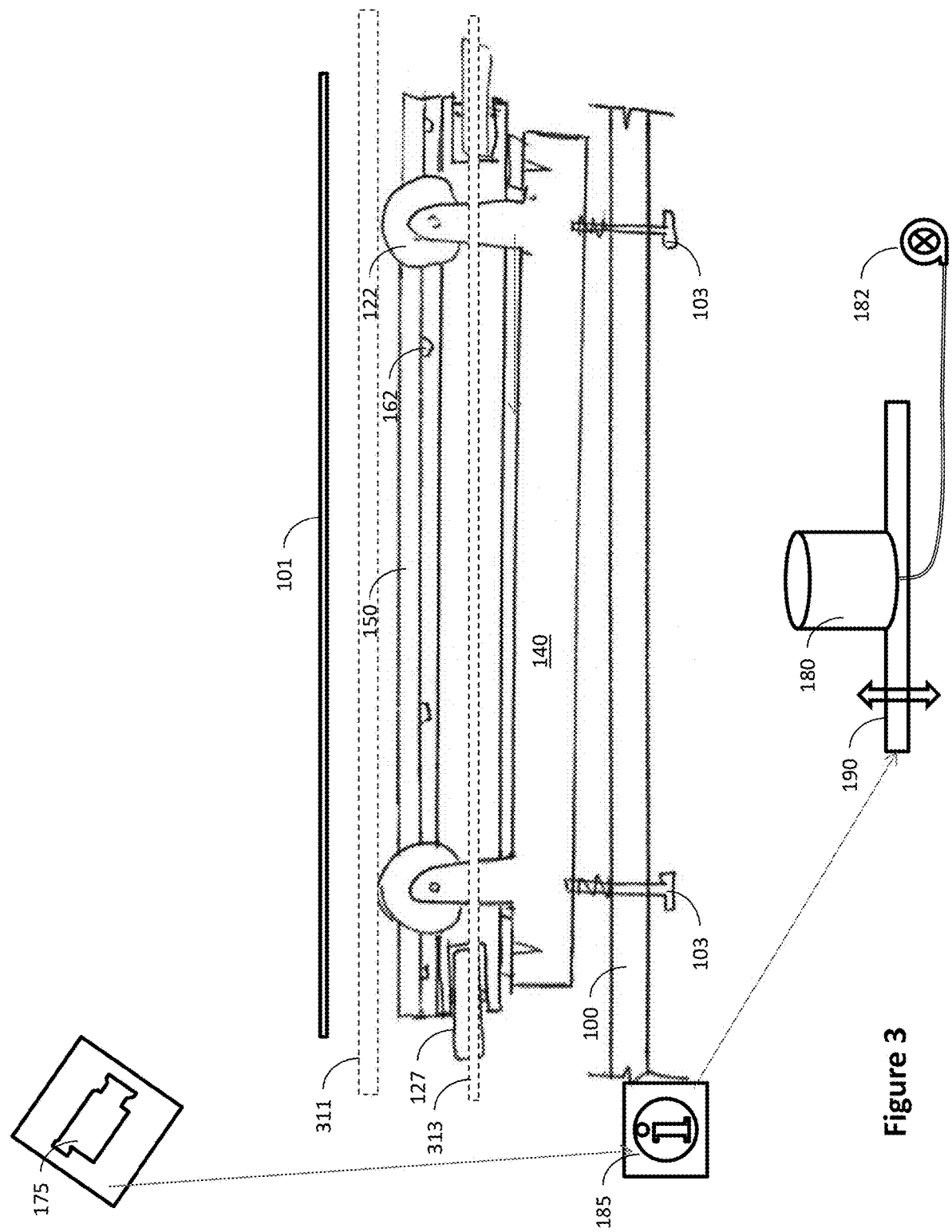
FIG. 3 illustrates an embodiment of the system employing the electrostatic chuck of FIG. 1.

FIG. 3 illustrates an example of a wafer alignment station for aligning the wafer onto the ESC assembly. Prior to transporting the ESC assembly to an alignment station, the wafer is loaded and chucked onto the ESC. In one example the process of loading and aligning a wafer proceeds as follows.

To load a wafer on to the ESC first the ESC puck 150 is lift by a vacuum chuck assembly, 170. The vacuum chuck assembly holds the ESC puck 150 at a fix elevation for easy wafer placement. After the wafer is loaded onto the ESC puck the wafer is electrostatically chucked by an electrical potential provided by an electrode embedded in 170 (FIG. 2B). After the wafer is electrostatically chucked 170 lowers and replaces puck 150 onto pedestal 160 and the full assembly can now be transported to the alignment station. Once the wafer is chucked, the coulomb forces maintain the wafer chucked even after the electrode 170 is removed. So once potential is applied to the ESC 154, the wafer is chucked and remains so even after the potential is removed, so the chuck can be lifted to be aligned to the straight edge. In these embodiments the ESC puck 150 is sized such that the wafer is about 1 mm larger than the ESC puck 150, so when the chuck is elevated for alignment, the camera 175 (FIG. 3) always sees the edge of the wafer, not the edge of the chuck. So while the chuck is moved, the alignment is according to the edge of the wafer, not the chuck.

In this example, the wafer is loaded onto the ESC puck 150 with relatively loose placement tolerance, i.e., a tolerance below what is required for processing alignment (e.g., +/−500 um). Once the wafer is chucked, the ESC is moved to an alignment station (although the alignment station may be integral to the loading station, such that loading and alignment can be done in the same station). Regardless, in the alignment station the horizontal alignment wheels 127 engage a straight edge 313 so as to align the pedestal in the horizontal direction, and the vertical alignment wheels 122 engage a straight edge 311 so as to align the pedestal in the vertical direction.

To perform the alignment, a pick-up head 180 engages the back of the chuck 150 and uses vacuum from pump 182 to hold the chuck. It then lifts the chuck 150 from the pedestal 160, with the wafer still chucked. The pick-up head engages the ESC puck 150 through a passage through the carrier, the base and the pedestal (see broken lines in FIG. 2B). The wafer is then imaged by the camera 175 that transmits the images to the controller 185. The controller 185 analyzes the images and calculates the position of the wafer relative to the reference edges. It then issues commands to the X-Y-Z-Theta stage 190 to moves the ESC so as to place the wafer at the correct alignment position. The pick-up head 180 is then lowered and once the ESC puck 150 has engaged the pedestal 160 and is held by the magnets 162, the vacuum is removed and the pick-up head 180 retracts out of the ESC assembly. At this point the wafer is very accurately aligned to the tangent line between the two alignment wheels. The alignment wheels/bearings were in intimate contact with the alignment rails and so as the carrier moves thru the system, subsequent alignment rails will engage the vertical and horizontal wheels, thereby precisely aligning the wafer to these alignment rails.

Thus, as can be seen from the above description, the three functions of transporting the wafer, aligning the wafer vertically, and aligning the wafer horizontally are totally decoupled and are performed by different elements of the system. This permits the construction of a relatively simple and inexpensive transport carriage. It also permits relaxing of the tolerances for most parts of the system, leading to a reduced cost. As long as the wafer is precisely positioned with respect to the alignment rollers, the alignment of the wafer at each station will be precise when the alignment rollers contact the alignment straight edges; regardless of the tolerances of any other the other parts of the system.

Figure 4B:
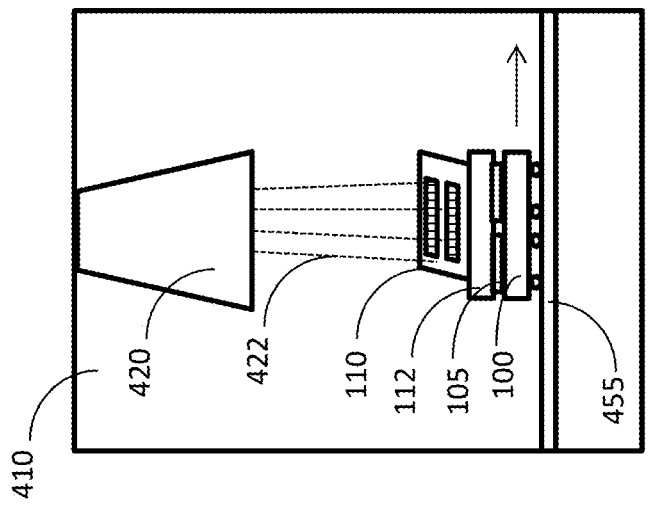
FIGS. 4A and 4B illustrate an ion implant system according to one embodiment.
Figure 4A:
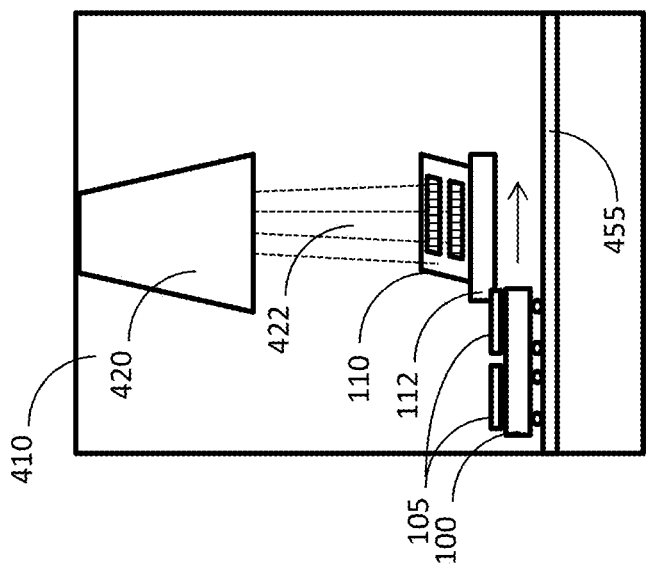

FIGS. 4A and 4B are schematics illustrating an ion implant system 410 according to one embodiment. In FIG. 4A the carriage 100 with the ESC assemblies 105 approaches the ion implant stage, while in FIG. 4B the carriage 100 with the ESC assemblies 105 is inside the ion implant stage, placing the ESC assemblies 105 under the masks 110. Specifically, the ion implant stage is formed by an ion source 420, which generates an ion beam 422. Masks 110 with tracks 112 are positioned in the line of travel of the ion beam 422, such that they block part of the ion beam and only let through part of the beam according to the design of the masks 110.

Carrier 100 can travel over transport tracks 455 towards the ion implant stage. When the carriage 100 enters the ion implant stage, the ESC assemblies 105 engage the tracks 112 so as to place the wafers in precise alignment to the masks 110. The wafers are then implanted with the ions that pass through the openings in the masks. The implant may be performed with the pedestals stationary under the masks, or with the pedestals in continuous travel under the masks, for a pass-by ion implant.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Various aspects and/or components of the described embodiments may be used singly or in any combination. It is intended that the specification and examples be considered as exemplary only, with a true scope and spirit of the invention being indicated by the following claims.

The invention claimed is:

1. A system for transporting substrates in a processing system, comprising:
   a carriage configured for supporting and transporting a plurality of chuck assemblies;
   a plurality of chuck assemblies positioned on the carriage, each of the chuck assemblies comprising:
   a plurality of vertical height control rollers configured to control vertical position of the substrate;
   a plurality of horizontal alignment rollers configured to control horizontal position of the substrate;
   an electrostatic chuck configured to hold a substrate in alignment to the vertical control rollers and the horizontal alignment rollers; and,
   wherein each of the chuck assemblies comprises a base, a pedestal, and a plurality of conductive sliding pads positioned between the base and the pedestal.

2. The system of claim 1, wherein the carriage defines a plurality of seats, each seat configured for supporting one of the plurality of chuck assemblies.

3. The system of claim 2, wherein
   the vertical height control rollers are attached to the base;
   the pedestal is slidably positioned on top of the base and wherein the horizontal alignment rollers are attached to the pedestal.

4. The system of claim 3, further comprising a vertical urging mechanism urging each of the chuck assemblies vertically upwards from the carriage.

5. The system of claim 4, wherein each of the chuck assemblies further comprises a plurality of magnets embedded in the pedestal and configured to hold the electrostatic chuck.

6. The system of claim 1, further comprising:
   an alignment station having at least one alignment camera, a pick-up head positioned on a stage, and a controller receiving images from the alignment camera and sending control signals to the stage to align the substrate.

7. The system of claim 6, wherein the alignment station further comprises a vertical alignment wall and a horizontal alignment wall; and wherein the vertical height control rollers are configured to engage the horizontal alignment wall and the horizontal alignment rollers are configured to engage the horizontal alignment wall.

8. A system for transporting substrates in a processing system, comprising a carriage upon which a plurality of chuck assemblies are positioned, wherein each of the chuck assemblies is configured to hold a single substrate and includes: a base having vertical alignment wheels configured to place the substrate in vertical alignment, a pedestal configured to slide on the base, conductive sliding pads positioned between the base and the pedestal, a set of horizontal alignment wheels attached to the pedestal and is configured to align the substrate in horizontal direction, and an electrostatic chuck position over the pedestal.

9. The system of claim 8, wherein each of the chuck assemblies further comprise a plurality of magnets embedded in the pedestal and configured to engage and hold the electrostatic chuck on the pedestal.

10. The system of claim 8, further comprising vertical urging mechanism positioned between the carriage and each of the pedestals and configured to engage and urge each of the pedestals vertically away from the carriage.

11. The system of claim 10, wherein the vertical urging mechanism comprises a plurality of spring-loaded pins.

12. The system of claim 8, wherein the electrostatic chuck comprises a plate of dielectric material attached to a metal plate.

13. The system of claim 12, further comprising a vertically movable rod configured to, when moved vertically to assume a raised position, contact and apply electrical potential to the metallic plate.

14. The system of claim 8, further comprising a pick-up head configured to engage and elevate the electrostatic chuck from the pedestal.

15. A system for transporting substrates in a processing system, comprising:
   a carriage upon which a plurality of chuck assemblies are positioned, the carriage configured for transporting the plurality of chuck assemblies in a processing system;
   wherein each of the chuck assemblies is configured to hold a single substrate and comprises:

a base having vertical alignment wheels configured to engage vertical alignment straight edge to thereby place the base in vertical alignment to the vertical alignment straight edge;

a pedestal slidably positioned on the base;

a set of horizontal alignment wheels attached to the base and configured to engage a horizontal alignment straight edge to thereby align the pedestal in horizontal direction to the horizontal alignment straight edge;

an electrostatic chuck removably positioned over the pedestal; and, a plurality of conductive sliding pads.

16. The system of claim 15, further comprising an alignment station comprising:

a camera;

an x-y-z-theta stage;

a pick-up head positioned on the x-y-z-theta stage and configured to engage and raise the electrostatic chuck from the pedestal;

a controller receiving images from the camera and sending signals to control operation of the x-y-z-theta stage.

17. The system of claim 15, further comprising vertical urging mechanism positioned between the carriage and each of the chuck assemblies and configured to engage and urge each of the chuck assemblies vertically away from the carriage.

18. The system of claim 15, wherein each of the pedestals further comprises a plurality of magnets configured to engage and hold the electrostatic chuck.

* * * * *